(12) United States Patent
Wu

(10) Patent No.: US 11,677,399 B1
(45) Date of Patent: Jun. 13, 2023

(54) INTERFACE CIRCUIT

(71) Applicant: NANYA TECHNOLOGY CORPORATION, New Taipei (TW)

(72) Inventor: Chang-Ting Wu, Hsinchu County (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 17/567,891

(22) Filed: Jan. 4, 2022

(51) Int. Cl.
*H03K 3/00* (2006.01)
*H03K 19/00* (2006.01)
*H03K 19/0185* (2006.01)
*H03K 19/003* (2006.01)

(52) U.S. Cl.
CPC ..... *H03K 19/0016* (2013.01); *H03K 19/0013* (2013.01); *H03K 19/00315* (2013.01); *H03K 19/018521* (2013.01)

(58) Field of Classification Search
CPC .......... H03K 19/0013; H03K 19/0016; H03K 19/00315; H03K 19/018521
See application file for complete search history.

(56) References Cited

U.S. PATENT DOCUMENTS 7,304,511 B2 * 12/2007 Kawano .......... H03K 19/00315
326/82
8,797,790 B1 * 8/2014 Rahim ................ G11C 11/4125
365/156
2003/0137327 A1 7/2003 Moon
2004/0212398 A1 10/2004 Kitazawa et al.
2006/0214684 A1 9/2006 Bando et al.
2010/0271069 A1 * 10/2010 Kim .................... G11C 7/1084
365/189.11
2012/0019282 A1 1/2012 Millar

FOREIGN PATENT DOCUMENTS

TW 234217 11/1994

OTHER PUBLICATIONS

"Office Action of Taiwan Counterpart Application", dated Oct. 27, 2022, p. 1-p. 4.

* cited by examiner

Primary Examiner — Kurtis R Bahr
(74) Attorney, Agent, or Firm — JCIPRNET

(57) ABSTRACT

The interface circuit includes a first transistor, a second transistor, a first switch, a first logic circuit and a second logic circuit. The first transistor is controlled by a enable signal. The second transistor is controlled by a first control signal. The first switch is coupled between a second end of the first transistor and the output end of the interface circuit, wherein the first switch is controlled by a second control signal. The first logic circuit generates the first control signal according to the enable signal and at least one indication signal. The second logic circuit generates the second control signal according to the first control signal and the enable signal.

14 Claims, 11 Drawing Sheets

INTERFACE CIRCUIT

BACKGROUND OF THE INVENTION

Field of Invention

The present invention generally relates to an interface circuit, and more particularly to the interface circuit with weak pull-up structure.

Description of Prior Art

Please refer to FIG. 1A which is a circuit plot of an interface circuit in prior art. The interface circuit 100 includes transistors MP1 and MN1. The transistors MP1 and MN1 are coupled in series between a power end and a reference ground end, and are respectively controlled by control signals CT1 and CT2. The power end provides a power voltage VDD, and the reference ground end provides a reference ground voltage VSS. An output end of the interface circuit 100 is coupled to a pad PD, and there is a capacitor loading coupled between the pad PD and the reference ground end. The transistor MP1 has a driving ability which is weaker than a driving ability of the transistor MN1. The interface circuit 100 generates an output signal ALTN with a low voltage when the transistors MP1 and MN2 are both turned on according to the control signals CT1 and CT2.

Please refer to FIG. 1B and FIG. 1C, which are waveform plots of the interface circuit of FIG. 1A in different operation conditions. In a normal condition, refer to FIG. 1B, during a time period T1, the output signal ALTN can be pulled down from the power voltage VDD with an amplitude H1 during a time period T2, and be held on the reference ground voltage VSS during a time period T3. After the time period T3, the output signal ALTN can be pulled up toward to the power voltage VDD during a time period T4. In an application specification, lengths of the time periods T1 to T4 have their own definitions. In general, A total length of the time periods T2 to T4 cannot longer than the length of the time period T1.

In an abnormal condition, refer to FIG. 1C, the driving ability of at least one of the transistors MP1 and MN1 is varied. In this case, the driving ability of the transistor MP1 is stronger, or the driving ability of the transistor MN1 is weaker, or the driving ability of the transistor MP1 is stronger and the driving ability of the transistor MN1 is weaker caused by the process variation. The pulled down amplitude is smaller than the amplitude H1, and the output signal ALTN cannot be pulled to the reference ground voltage VSS during the time period T2. Such as that, the time period T3 is missed. Such as that, the output signal ALTN cannot be identified by external electronic device, and a function of the interface circuit 100 is failed.

SUMMARY OF THE INVENTION

The present invention provides an interface circuit which can overcome process variation and provide correct output signal.

The interface circuit includes a first transistor, a second transistor, a first switch, a first logic circuit and a second logic circuit. A first end of the first transistor receives a power voltage, and the first transistor is controlled by a enable signal. The second transistor is coupled between an output end of the interface circuit and a reference ground end, and is controlled by a first control signal. The first switch is coupled between a second end of the first transistor and the output end of the interface circuit, wherein the first switch is controlled by a second control signal. The first logic circuit is coupled to the second transistor and generates the first control signal according to the enable signal and at least one indication signal. The second logic circuit is coupled to the first logic circuit and the first switch, wherein the second logic circuit generates the second control signal according to the first control signal and the enable signal.

Accordingly, the interface circuit provides the first switch to cut off a connection path between the first transistor and the output end of the interface circuit when the second transistor is turned on. Such as that, the second transistor needs not to fight with the first transistor when the interface circuit generates an output signal with a low voltage. A waveform of the output signal is not affected by a process variation, and the interface circuit can provide the output signal with good quality.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
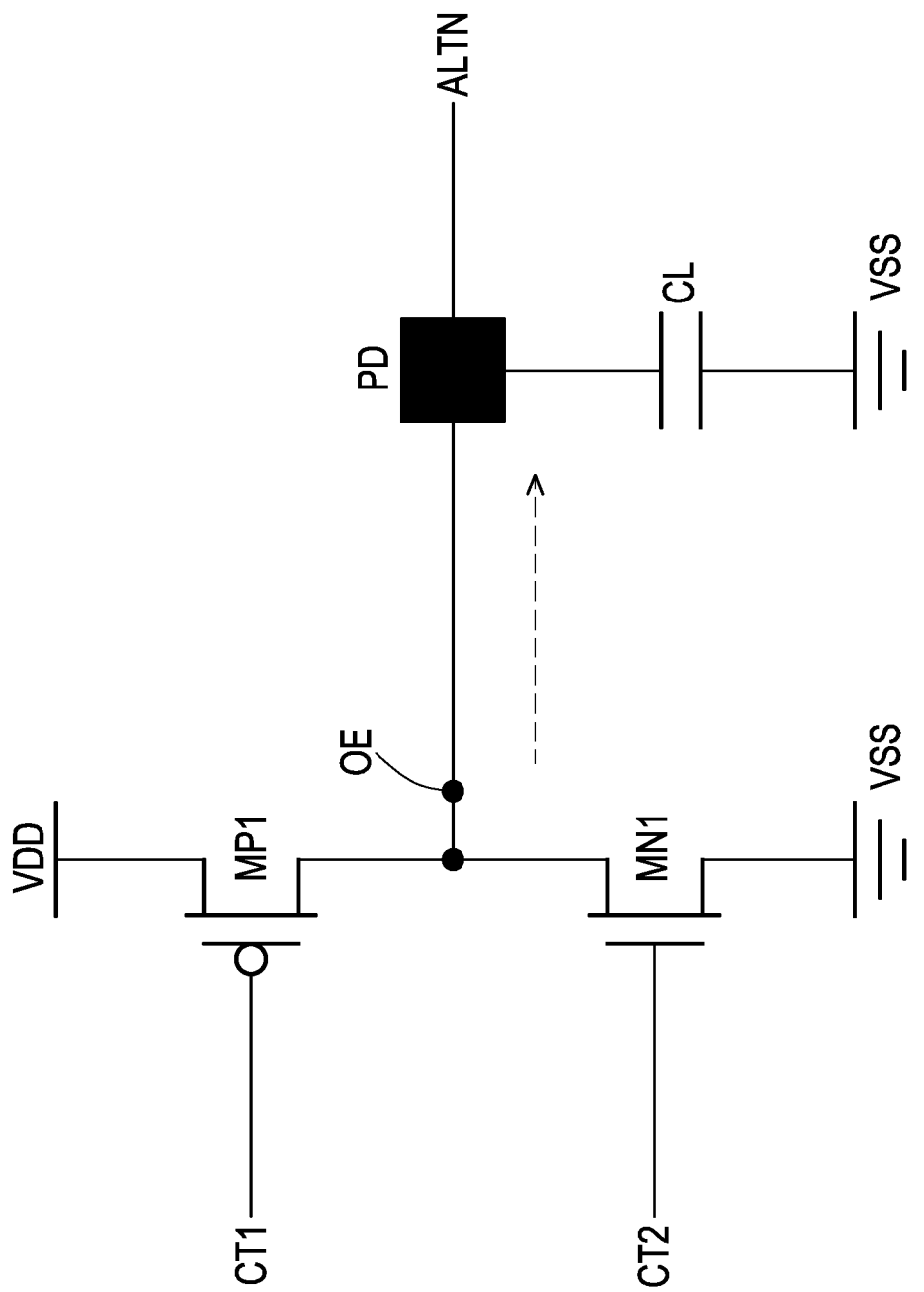
FIG. 1A is a circuit plot of an interface circuit in prior art.
Figure 1B:
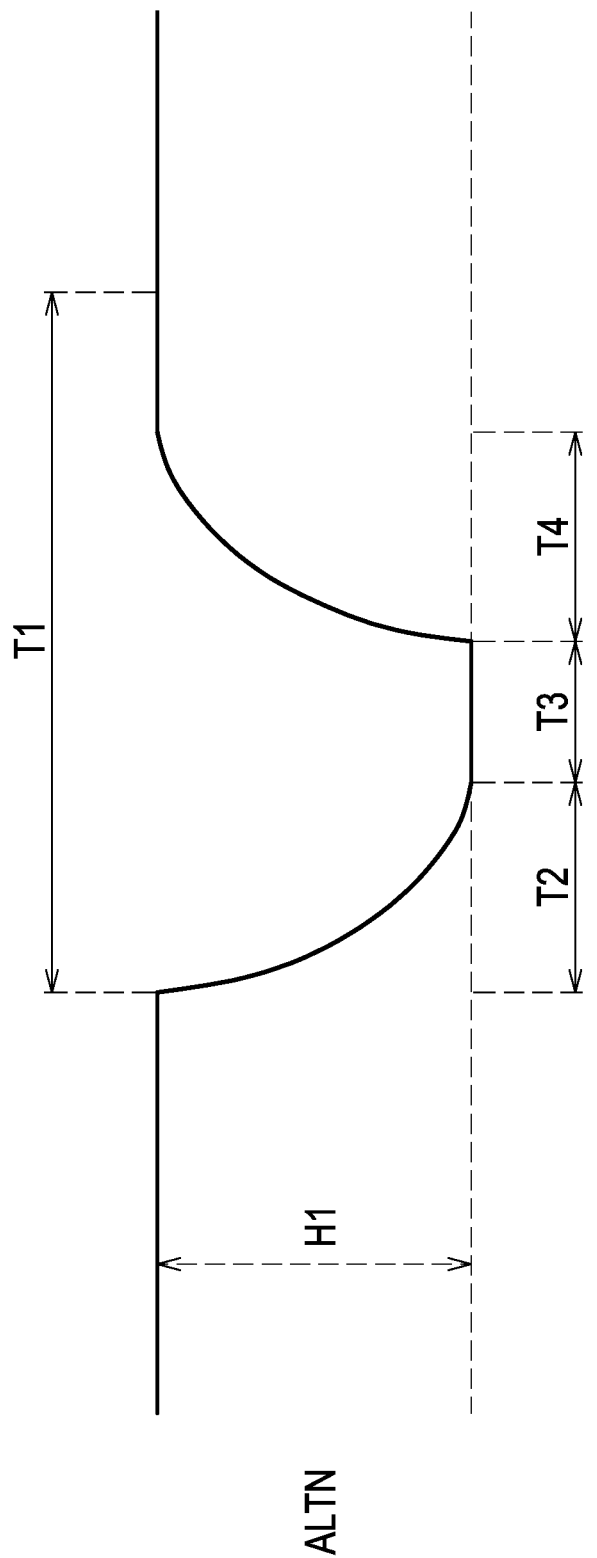
FIG. 1B and FIG. 1C are waveform plots of the interface circuit of FIG. 1A in different operation conditions.
Figure 1C:
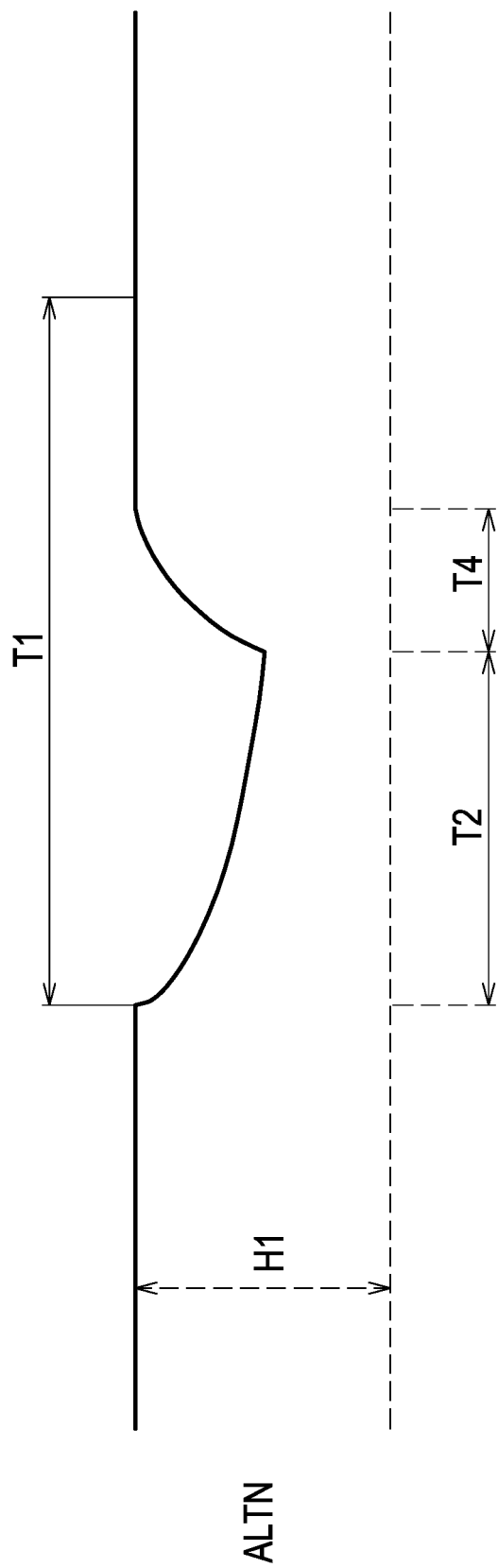

Reference will now be made in detail to the present preferred embodiment of the invention, examples of which are illustrated in the accompanying drawings. Wherever possible, the same reference numbers are used in the drawings and the description to refer to the same or like parts.

Figure 2:
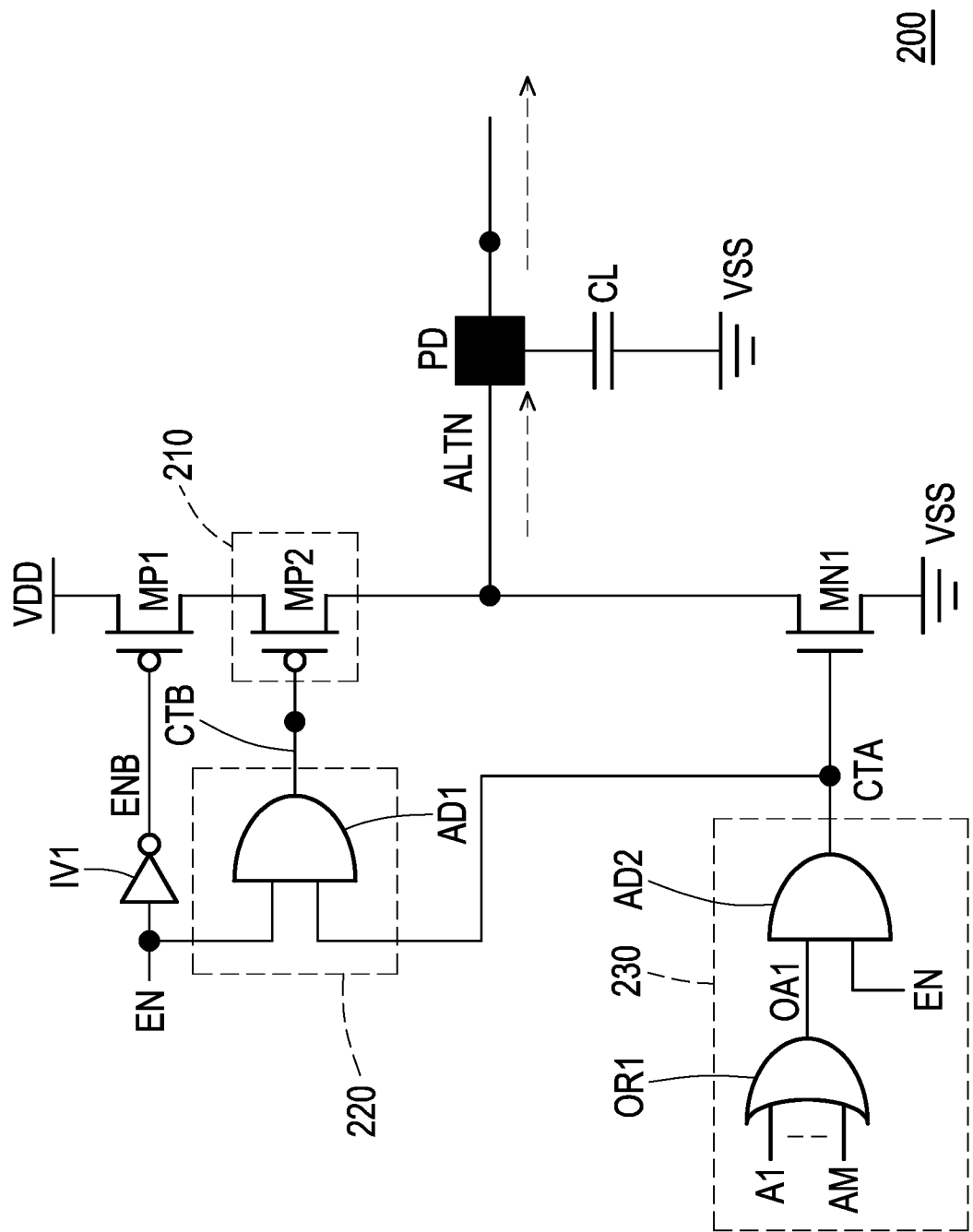
FIG. 2 illustrates a schematic diagram of an interface circuit according to an embodiment of present disclosure.

Please refer to FIG. 2, which illustrates a schematic diagram of an interface circuit according to an embodiment of present disclosure. The interface circuit 200 includes transistors MP1 and MN1, a switch 210 and logic circuits 220 and 230. A first end of the transistor MP1 is coupled to a power end to receive a power voltage VDD, a second end of the transistor MP1 is coupled to the switch 210, and a control end of the transistor MP1 receives an inverted enable signal ENB. The switch 210 is formed by a transistor MP2. The transistor MP2 is coupled between the transistor MP1 and an output end of the interface circuit 200, and a control end of the transistor MP2 is coupled to the logic circuit 220 to receive a control signal CTB. The transistor MN1 is coupled between the output end of the interface circuit 200 and a reference ground end. The reference ground end is used to provides a reference ground voltage VSS. A control end of the transistor MN1 is coupled to the logic circuit 230 to receive a control signal CTA. In this embodiment, both of the transistors MP1 and MP2 are P-type transistors, and the transistor MN1 is a N-type transistor. The transistor MP1 has a driving ability weaker than a driving ability of the transistor MN1. In this embodiment, since the transistor MP1 is applied for TTL logic, the transistor MP1 may has more weaker driving ability. Such as a channel of the transistor MP1 may has small width to length ratio, or the transistor MP1 has less finger number than the transistor MN1.

In this embodiment, the inverted enable signal ENB is generated by an inverter IV1. The inverter IV1 receives an enable signal EN and generated the inverted enable signal to the control end of the transistor MP1. The enable signal EN is used to indicate the interface circuit 200 to be at an input mode or an output mode. In here, when the enable signal EN is at logic 1, the interface circuit 200 is at the output mode, and when the enable signal EN is at logic 0, the interface circuit 200 is at the input mode.

The logic circuit 230 includes an OR logic gate OR1 and an AND logic gate AD2. The OR logic gate may have a plurality of input end to receives a plurality of indication signals A1~AM, and the OR logic gate generates an operation result OA1 by performing a logic OR operation on indication signals A1~AM. The AND logic gate receives the operation result OA1 and the enable signal EN, and generates the control signal CTA by performing an AND logic operation on the operation result OA1 and the enable signal EN.

The logic circuit 220 is used to perform an AND logic operation on the enable signal EN and the control signal CTA. In this embodiment, the logic circuit 220 includes an AND gate AD1. The AND gate AD1 receives the enable signal EN and the control signal CTA and generates the control signal CTB according to the enable signal EN and the control signal CTA.

About a detail operation of the interface circuit 200, when the interface circuit 200 is at the output mode, the enable signal is set to logic 1, and the transistor MP1 is turned-on. At this time, if at least one of the indication signals A1~AM is at logic 1, the AND gate can generate the control signal CTA which is at logic 1, too. Accordingly, the transistor MN1 can be turned-on.

It should be noted here, since the control signal CTA is at logic 1, the logic circuit 220 can generate the control signal CTB with logic 1. Such as that, the switch 210 is cut-off, and a connection path between the transistor MP1 and the output end of the interface circuit 200 is cut-off correspondingly. It can be realized, the output signal ALTN can be pulled to the reference ground voltage VSS successfully by the transistor MN1 without fighting with the transistor MP1. Since the transistor MN1 doesn't fight with the transistor MP1 to pull down the output signal ALTN, variations on the driving abilities of the transistor MP1 and MN1 makes low effect on the output signal ALTN.

Figure 3:
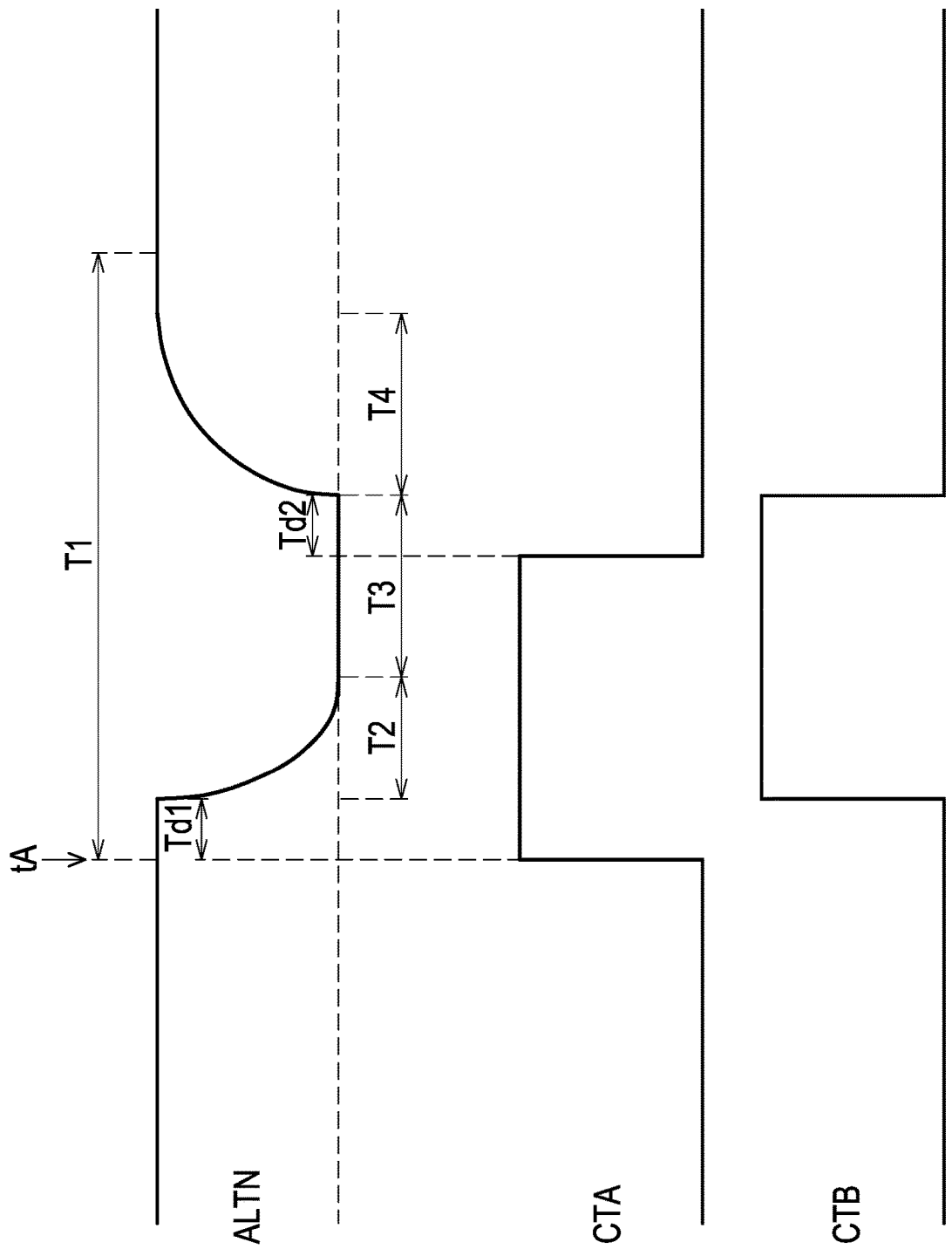
FIG. 3 illustrates a waveform plot of the interface circuit 200 of FIG. 2 of present disclosure.

Please refer to FIG. 3 and FIG. 2 commonly, where FIG. 3 illustrates a waveform plot of the interface circuit 200 of FIG. 2 of present disclosure. During a time period T1, at a time point tA, the enable signal EN can be set to logic 1 and the control signal CTA can be pulled up to logic 1 by the logic circuit 230. After a delay time Td1, the control signal CTB is pulled up to logic 1 by the logic circuit 220. The delay time Td1 can a gate delay of the AND gate AD1 in the logic circuit 220. When the control signal CTB is pulled up to logic 1, the switch 210 is cut-off, and the output signal ALTN starts to be pulled down by the turned-on transistor MN1 during a time period T2. Since the transistor MN1 needs not to fight with the transistor MP1, the output signal ALTN can be pulled to the reference ground voltage VSS successfully during the time period T2. The output signal ALTN can be held on the reference ground voltage VSS for a time period T3.

Moreover, after all of the indication signals A1~AM return to logic 0, and the logic circuit 230 can set the control signal CTA to logic 0. The transistor MN1 can be cut-off according to the control signal CTA with logic 0. After a delay time Td2, the logic circuit 220 can set the control signal CTB to logic 0. When the control signal CTB is at logic 0, the switch 210 can be turned-on, and the output signal ALTN can be pulled-up toward to the power voltage VDD during a time period T4.

Please refer to FIG. 2 again, the output end of the interface circuit 200 may be coupled to a pad PD of an integrated circuit. A loading capacitor CL may be coupled between the pad PD and the reference ground end.

In this embodiment, the indication signals A1~AM may be alert signals of the integrated circuit. According to the embodiment, the interface circuit 200 can provide the output signal ALTN with correct definition. Such as that, an external electronic circuit coupled to the pad PD can identify the output signal ALTN successfully.

Figure 4A:
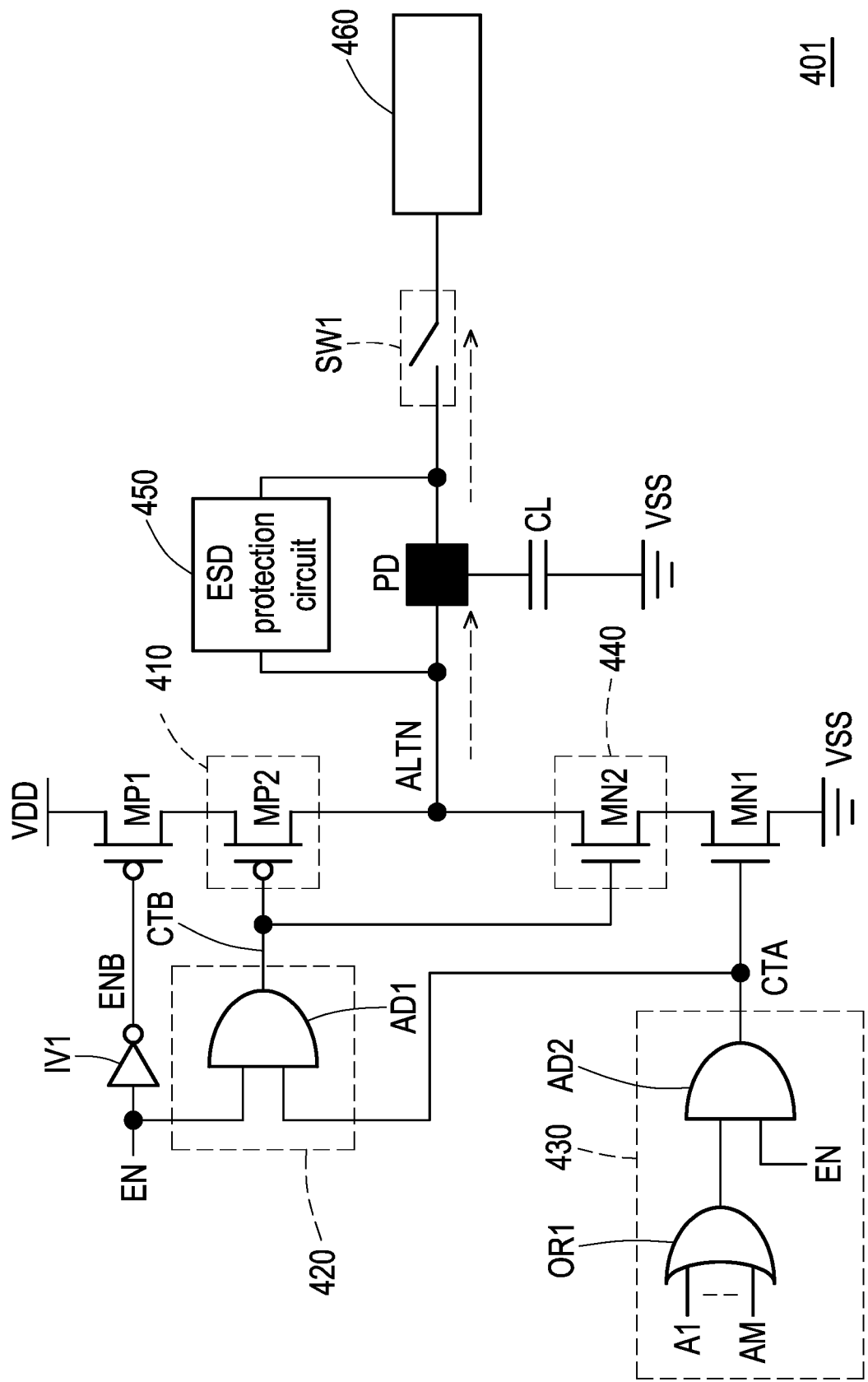
FIG. 4A and FIG. 4B are schematic diagrams of interface circuits according to different embodiments of present disclosure.
Figure 4B:
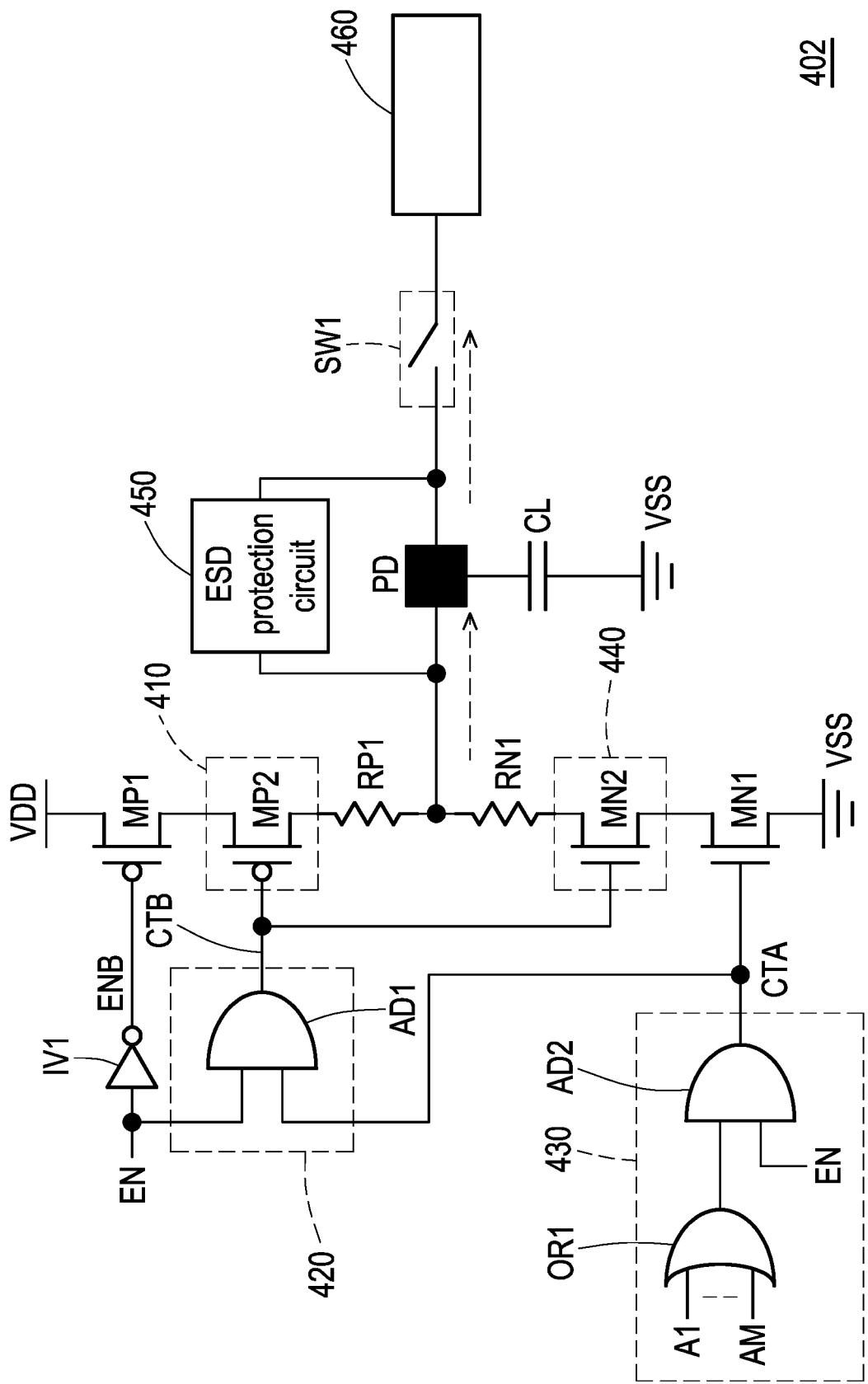

Please refer to FIG. 4A and FIG. 4B, which are schematic diagrams of interface circuits according to different embodiments of present disclosure. In FIG. 4A, an interface circuit 401 includes transistors MP1 and MN1, switches 410, 440, logic circuits 420 and 430 and an electrostatic discharge (ESD) protection circuit 450. Different from the interface circuit 200 in FIG. 2, the interface circuit 401 further includes the switch 440. The switch 440 is coupled between an output end of the interface circuit 401 and the transistor MN1. The switch 440 is controlled by a control signal CTB to be turned-on or cut-off. The switch 440 is formed by a transistor MN2, where the transistor MN2 has same conductive type with the transistor MN1. In this embodiment, the transistors MN1 and MN2 are both N-type transistors.

On the other hand, since the transistor MN2 and a transistor MP2 in the switch 410 have different conductive types and the transistors MN2 and MP2 are controlled by the same control signal CTB, the turned-on or cut-off statuses of the transistors MN2 and MP2 are different. In an output mode, the transistor MP2 can be cut-off according to the control signal CTB and the transistor MN2 can be turned on according to the control signal CTB.

The ESD protection circuit 450 is coupled to a pad PD which is coupled to the output end of the interface circuit 401. The ESD protection circuit 450 can be implemented by any ESD protection circuit structure well known by a person skilled in this art. Furthermore, in this embodiment, the switches 410 and 440 may be disposed adjacent to the pad PD, and the transistors MP2 and MN2 can be auxiliary ESD protection circuits. Such as that, a circuit structure of the ESD protection circuit 450 can be simplified to reduce a circuit size of the interface circuit 401.

In this embodiment, the interface circuit 401 further includes an output switch SW1 which is coupled between the pad PD and an external circuit 460. The output switch SW1 can be controlled by the enable signal EN, and if the enable signal EN indicates the interface circuit 401 to be in the output mode, the output switch SW1 can be cut-off. On the contrary, if the enable signal EN indicates the interface circuit 401 to be in an input mode, the output switch SW1 can be turned-on. In the output mode, the enable signal EN can be at logic 1, and in the input mode, the enable signal EN can be at logic 0. It should be noted here, in the input mode, the transistors MP1, MP2, MN2 and MN1 can be cut-off according to the enable signal EN. The pad PD can be in floating status.

Detail operation of the interface circuit 401 is similar to the interface circuit 200, and no more description here.

In FIG. 4B, the interface circuit 402 includes transistors MP1 and MN1, switches 410, 440, logic circuits 420 and 430, resistors RP1 and RN1 and an ESD protection circuit 450. Different from the interface circuit 401 in FIG. 4A, the interface circuit 402 further includes the resistors RP1 and RN1. The resistor RP1 is coupled between the output end of the interface circuit 402 and the switch 410. The resistor RN1 is coupled between the output end of the interface circuit 402 and the switch 440. The resistors RP1 and RN1 are used to enhance ESD protection ability of the interface circuit 402. In this embodiment, a circuit structure of the ESD protection circuit 450 can be more simplified to save a circuit size of the interface circuit 402.

Figure 5A:
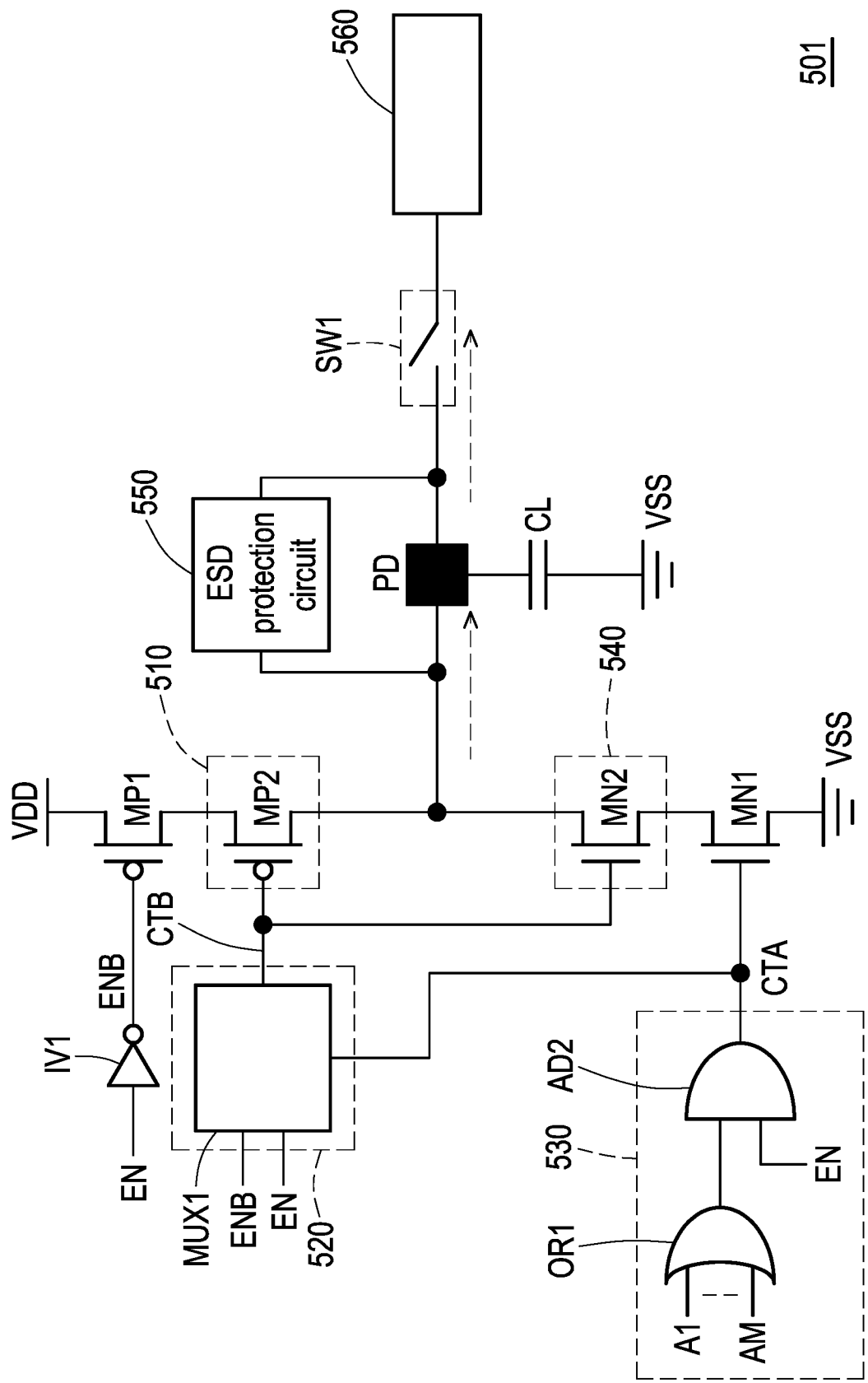
FIG. 5A and FIG. 5B are schematic diagrams of interface circuits according to different embodiments of present disclosure.
Figure 5B:
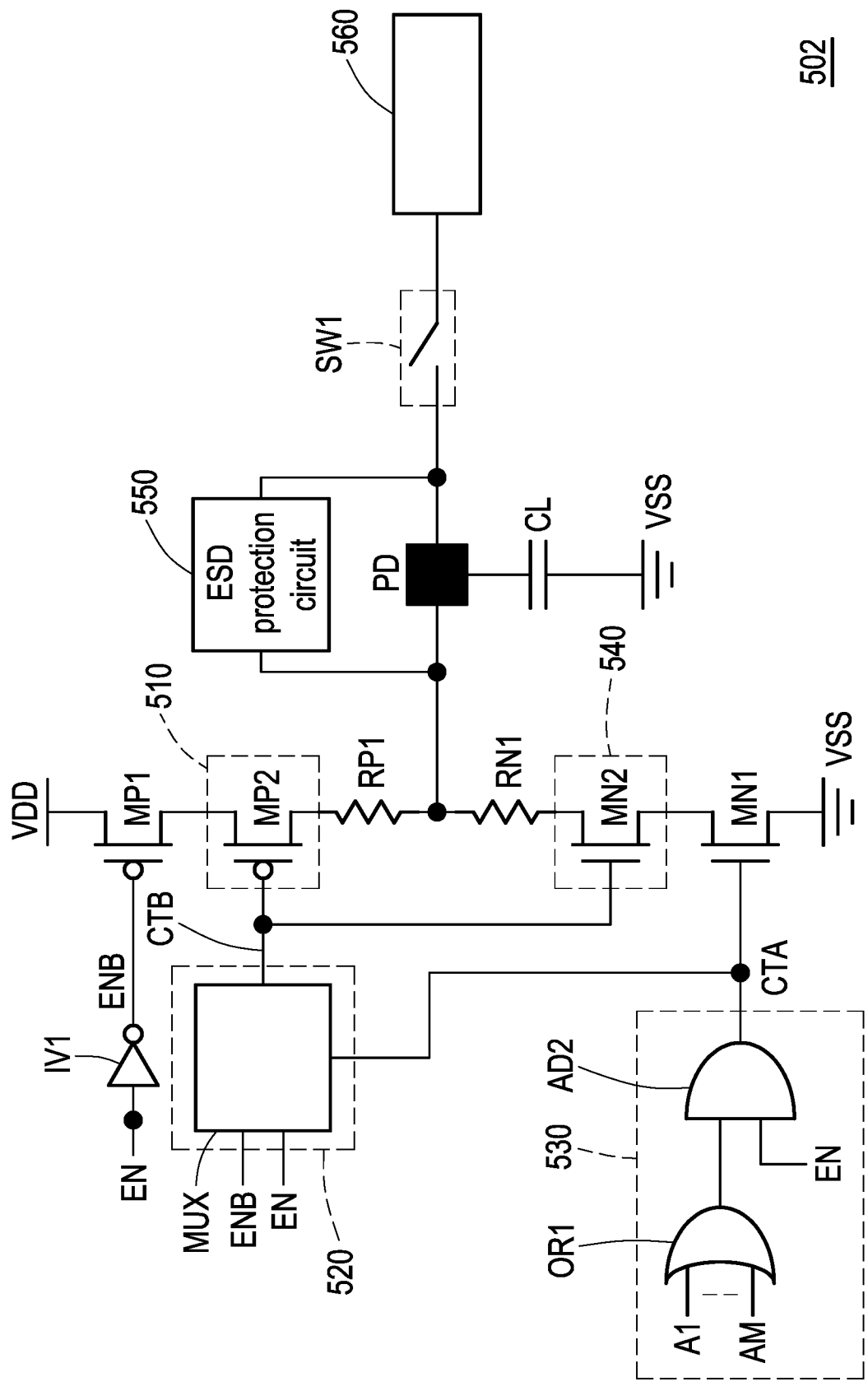

Please refer to FIG. 5A and FIG. 5B, which are schematic diagrams of interface circuits according to different embodiments of present disclosure. In FIG. 5A, an interface circuit 501 includes transistors MP1 and MN1, switches 510, 540, logic circuits 520 and 530 and an electrostatic discharge (ESD) protection circuit 550. Compare with the interface circuit 401 in FIG. 4A, the logic circuit 520 in FIG. 5A is formed by a multiplexer MUX1. The multiplexer MUX1 receives an enable signal EN, an inverted enable signal ENB and a control signal CTA. The control signal CTA is generated by the logic circuit 530 and the inverted enable signal ENB is generated by the inverter IV1. The multiplexer MUX1 selects one of the enable signal EN and the inverted enable signal ENB to be the control signal CTB according to the control signal CTA. In detail, if the control signal CTA is at logic 0, the multiplexer MUX1 selects the inverted enable signal ENB to be the control signal CTB, and if the control signal CTA is at logic 1, the multiplexer MUX1 selects the enable signal EN to be the control signal CTB. When the interface circuit 501 is in an output mode, the enable signal EN can be at logic 1 and the multiplexer MUX1 can generate the control signal CTB with logic 1 when the control signal CTA is at logic 1. Such as that, the switch 510 can be cut-off accordingly. In this time, both of the control signal CTB and the inverted enable signal ENB may equal to logic 0, the transistors MP1 and MP2 can be turned-on simultaneously, and the transistors MN1 and MN2 can be cut-off simultaneously. Signal on the pad PD can be weakly pulled high, and outputs a logic 1, correspondingly. This is a trigger behavior of an alert event of the output mode while the control signal CTA is at logic 1. The alert even is happened to pull the signal one the pad to logic 0 to inform an external device. Besides, when the interface circuit 501 is in an input mode, the enable signal EN is at logic 0 and the inverted enable signal ENB can be at logic 1. The logic circuit 530 can generate the control signal CTA which is at logic 0, and the multiplexer MUX1 can generate the control signal CTB with logic 1 according to the control signal CTA. Also, the switch 510 can be cut-off accordingly. That is, the multiplexer MUX1 can perform same function with a AND logic gate AD1 in the switch 420.

Detail operation of the interface circuit 501 is same to the interface circuit 401, and no more description here.

In FIG. 5B, the interface circuit 502 includes transistors MP1 and MN1, switches 510, 540, logic circuits 520 and 530, resistors RP1 and RN1 and an ESD protection circuit 550. Different from the interface circuit 501 in FIG. 5A, the interface circuit 502 further includes the resistors RP1 and RN1. The resistor RP1 is coupled between the output end of the interface circuit 501 and the switch 510. The resistor RN1 is coupled between the output end of the interface circuit 501 and the switch 540. The resistors RP1 and RN1 are used to enhance ESD protection ability of the interface circuit 502. In this embodiment, a circuit structure of the ESD protection circuit 550 can be more simplified to save a circuit size of the interface circuit 502.

Figure 6A:
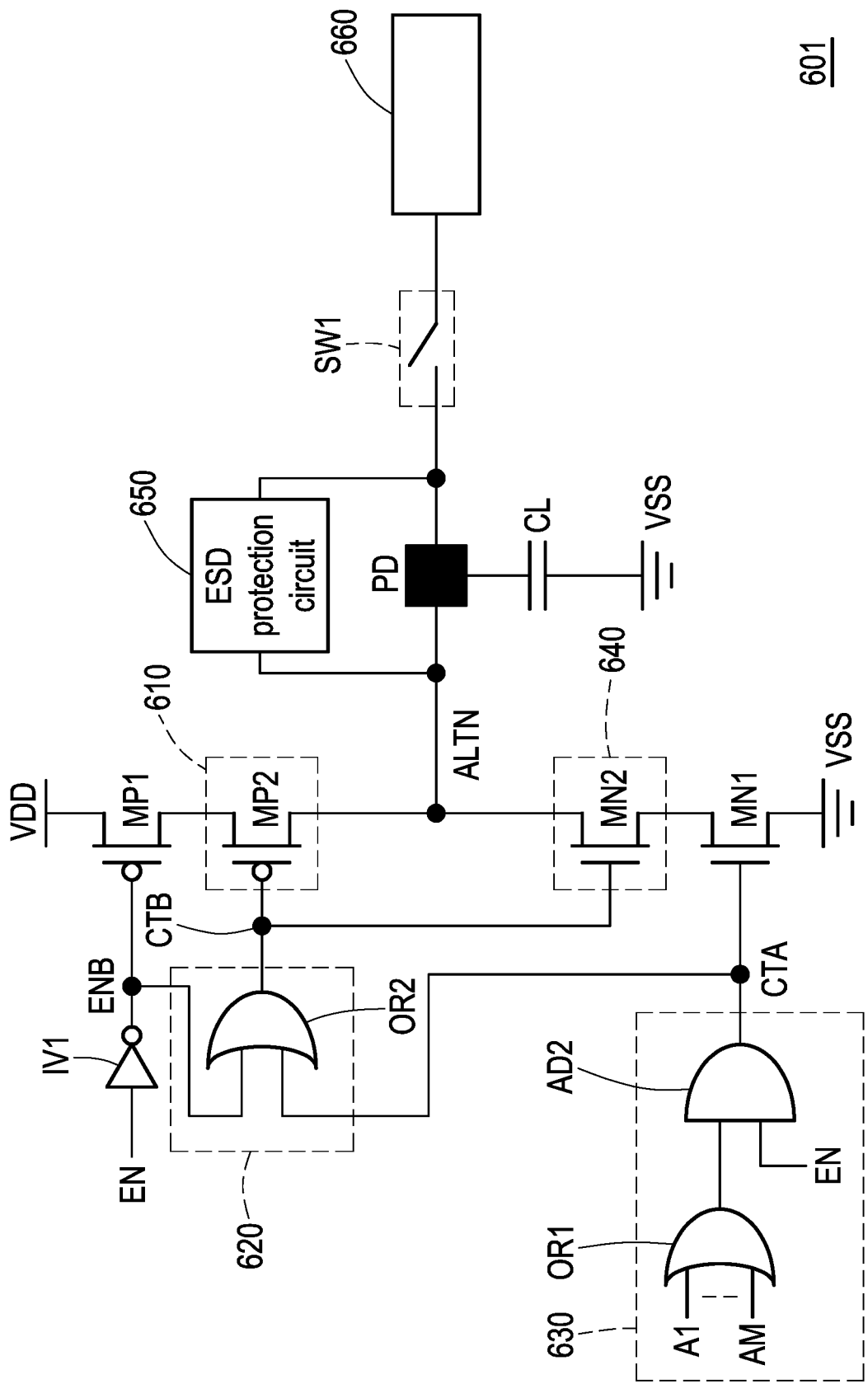
FIG. 6A and FIG. 6B are schematic diagrams of interface circuits according to different embodiments of present disclosure.
Figure 6B:
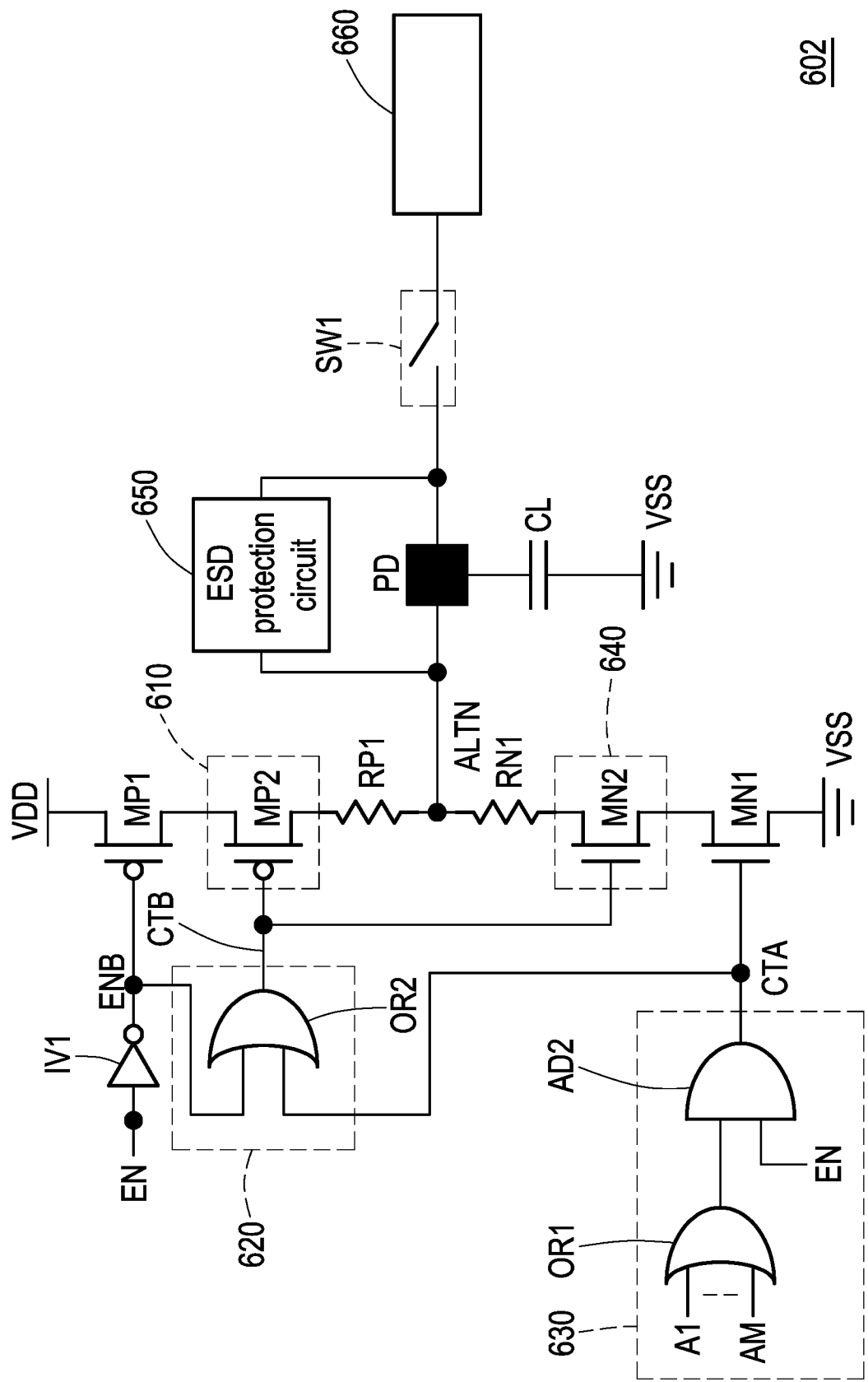

Please refer to FIG. 6A and FIG. 6B, which are schematic diagrams of interface circuits according to different embodiments of present disclosure. In FIG. 6A, an interface circuit 601 includes transistors MP1 and MN1, switches 610, 640, logic circuits 620 and 630 and an electrostatic discharge (ESD) protection circuit 650. Compare with the interface circuit 501 in FIG. 5A, the logic circuit 620 in FIG. 6A is formed by an OR logic gate OR2. The OR logic gate OR2 receives an inverted enable signal ENB and a control signal CTA. The control signal CTA is generated by the logic circuit 630 and the inverted enable signal ENB is generated by the inverter IV1. The OR logic gate OR2 performs OR operation on the inverted enable signal ENB and the control signal CTA to generate the control signal CTB. In detail, if the interface circuit 601 is in an output mode, the inverted enable signal is at logic 0. In this time, both of the control signals CTA and CTB may equal to logic 0, the transistors MP1 and MP2 can be turned-on simultaneously, and the transistors MN1 and MN2 can be cut-off simultaneously. Signal on the pad PD can be weakly pulled high, and outputs a logic 1, correspondingly. When the control signal CTA is at logic 1, the OR logic gate OR2 generates the control signal CTB is at logic 1 to cut-off the switch 610. This is a trigger behavior of an alert event of the output mode while the control signal CTA is at logic 1. The alert even is happened to pull the signal one the pad to logic 0 to inform an external device. Besides, if the interface circuit 601 is in an input mode, the inverted enable signal ENB is at logic 1, and the OR logic gate OR2 can generate the control signal CTB is at logic 1 according to the inverted enable signal ENB to cut-off the switch 610. That is, the OR logic gate OR2 can perform same function with the multiplexer MUX1 in the switch 520.

Detail operation of the interface circuit 601 is same to the interface circuit 401, and no more description here.

In FIG. 6B, the interface circuit 602 includes transistors MP1 and MN1, switches 610, 640, logic circuits 620 and 630, resistors RP1 and RN1 and an ESD protection circuit 550. Different from the interface circuit 601 in FIG. 6A, the interface circuit 602 further includes the resistors RP1 and RN1. The resistor RP1 is coupled between the output end of the interface circuit 601 and the switch 610. The resistor RN1 is coupled between the output end of the interface circuit 601 and the switch 640. The resistors RP1 and RN1 are used to enhance ESD protection ability of the interface circuit 602. In this embodiment, a circuit structure of the ESD protection circuit 650 can be more simplified to save a circuit size of the interface circuit 602.

In summary, the interface circuit of presented disclosure provides the switch which is coupled between an output end and a first transistor of the interface circuit, where the first transistor is used to pull up an output signal on the output end. When the interface circuit is in an output mode, and the interface circuit needs to generate the output signal with a low voltage level, a second transistor used to pull down the output signal is turned on and the switch is cut-off accordingly. Such as that, the second transistor needs not to fight with the first transistor, and the output signal can be pulled down successfully. On the other hand, in the output mode, during a normal operation, the second transistor is cut-off and the first transistor is turned-on to weakly pull up a signal on the pad. During an alert event, the first transistor can be cut-off and the second transistor is turned-on to pull down the signal on the pad to generate. By alternatively pulling up and pulling down the signal on the pad, an alert signal with pulses transited between logic 1 and 0 can be transported to an external device. Since the first transistor and the output end can be isolated by the switch in output mode, an influence to the output signal caused by process variation can be minimized. The output signal can be identified by external circuit, and the performance of the interface circuit can be enhanced.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An interface circuit, comprising:
a first transistor, wherein a first end of the first transistor receives a power voltage, and the first transistor is controlled by a enable signal;
a second transistor, coupled between an output end of the interface circuit and a reference ground end, and being controlled by a first control signal;
a first switch, coupled between a second end of the first transistor and the output end of the interface circuit, wherein the first switch is controlled by a second control signal;
a first logic circuit, coupled to the second transistor, generating the first control signal according to the enable signal and at least one indication signal; and
a second logic circuit, coupled to the first logic circuit and the first switch, wherein the second logic circuit generates the second control signal according to the first control signal and the enable signal,
wherein when the first transistor is turned-on according to the enable signal, the second transistor is turned-on according to the first control signal, and the first switch is cut-off according to the second control signal.

2. The interface circuit according to claim 1, wherein a driving ability of the first transistor is weaker than a driving ability of the second transistor.

3. The interface circuit according to claim 1, further comprising:
an inverter, having an input end for receiving the enable signal, and having an output end being coupled to a control end of the first transistor.

4. The interface circuit according to claim 1, wherein the second logic circuit performs an AND logic operation on the enable signal and the first control signal.

5. The interface circuit according to claim 1, wherein the first logic circuit comprises:
an OR gate, performing an OR logic operation on the at least one indication signal to generate an operation result; and
an AND gate, performing an AND logic operation on the operation result and the enable signal to generate the first control signal.

6. The interface circuit according to claim 1, further comprising:
a second switch, coupled between the output end of the interface circuit and the second transistor, wherein the second switch is controlled by the second control signal.

7. The interface circuit according to claim 6, wherein the first switch is formed by a third transistor, and the second switch is formed by a fourth transistor, and conductive types of the first transistor and the third transistor are same, conductive types of the second transistor and the fourth transistor are same, and the conductive types of the first transistor and the second transistor are different.

8. The interface circuit according to claim 6, further comprising:
a first resistor, coupled between the output end of the interface circuit and the first switch in series; and
a second resistor, coupled between the output end of the interface circuit and the second switch in series.

9. The interface circuit according to claim 1, wherein the second logic circuit is a multiplexer, wherein the multiplexer selects one of the enable signal and an inverted enable signal according to the first control signal to be the second control signal.

10. The interface circuit according to claim 1, wherein the second logic circuit performs an OR logic operation on an inverted enable signal and the first control signal.

11. The interface circuit according to claim 1, wherein the output end of the interface circuit is coupled to a pad of an integrated circuit.

12. The interface circuit according to claim 11, further comprising:
an electrostatic discharge (ESD) protection circuit, coupled to the pad.

13. The interface circuit according to claim 1, wherein the interface circuit is at an input mode when the first transistor is cut-off and the interface circuit is at an output mode when the first transistor is turned-on.

14. The interface circuit according to claim 1, further comprising:
an output switch, coupled between the output end of the interface circuit and an external circuit, and controlled by the enable signal.

* * * * *